(12) United States Patent
Dekker et al.

(10) Patent No.: US 7,891,836 B2
(45) Date of Patent: Feb. 22, 2011

(54) SEMICONDUCTOR LIGHT-EMITTING DEVICE WITH IMPROVED HEATSINKING

(75) Inventors: Ronald Dekker, Eindhoven (NL); Eduard Johannes Meijer, Eindhoven (NL); Eugene Timmering, Eindhoven (NL); Marc Andre De Samber, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 97 days.

(21) Appl. No.: 11/577,367

(22) PCT Filed: Oct. 17, 2005

(86) PCT No.: PCT/IB2005/053403

§ 371 (c)(1),
(2), (4) Date: Apr. 17, 2007

(87) PCT Pub. No.: WO2006/043234

PCT Pub. Date: Apr. 27, 2006

(65) Prior Publication Data

US 2008/0068842 A1    Mar. 20, 2008

(30) Foreign Application Priority Data

Oct. 22, 2004    (EP) .................... 04105248

(51) Int. Cl.
*F21V 4/00*    (2006.01)
(52) U.S. Cl. .................... 362/249.02; 362/294; 257/705

(58) Field of Classification Search ............. 362/227, 362/249, 294, 373, 545, 555, 800; 257/704, 257/705, 712, 98, 99
See application file for complete search history.

(56) References Cited

U.S. PATENT DOCUMENTS

| | | | | |
|---|---|---|---|---|
| 3,663,868 A | * | 5/1972 | Noguchi et al. | 257/704 |
| 3,946,428 A | * | 3/1976 | Anazawa et al. | 257/664 |
| 4,115,837 A | * | 9/1978 | Beall et al. | 361/708 |
| 4,340,902 A | * | 7/1982 | Honda et al. | 257/722 |
| 5,193,053 A | * | 3/1993 | Sonobe | 257/668 |
| 5,442,234 A | | 8/1995 | Laing | |
| 6,428,189 B1 | * | 8/2002 | Hochstein | 362/373 |
| 6,480,389 B1 | | 11/2002 | Shie et al. | |
| 6,517,218 B2 | * | 2/2003 | Hochstein | 362/294 |
| 6,834,977 B2 | * | 12/2004 | Suehiro et al. | 362/187 |
| 6,874,910 B2 | * | 4/2005 | Sugimoto et al. | 362/294 |
| 6,949,771 B2 | * | 9/2005 | Yoganandan et al. | 257/99 |
| 2001/0032985 A1 | | 10/2001 | Bhat et al. | |
| 2004/0079957 A1 | | 4/2004 | Andrews et al. | |

FOREIGN PATENT DOCUMENTS

| | | |
|---|---|---|
| EP | 1139439 | 10/2001 |
| JP | 60171780 | 9/1985 |
| JP | 61061458 | 3/1986 |
| JP | 7038208 | 2/1995 |

* cited by examiner

*Primary Examiner*—Hargobind S Sawhney

(57) ABSTRACT

The present invention relates to a light-emitting device comprising a substrate, a circuitry, a LED in electrical connection with said circuitry, and a heat sink arranged to transport heat away from the LED, wherein the LED is in thermal contact with said heat sink through an opening in said substrate. The present invention also relates to methods for the manufacture of such a device.

10 Claims, 2 Drawing Sheets

SEMICONDUCTOR LIGHT-EMITTING DEVICE WITH IMPROVED HEATSINKING

FIELD OF THE INVENTION

The present invention relates to a light-emitting device comprising a substrate, a circuitry, at least one heat sink and at least one LED electrically connected to said circuitry. The present invention also relates to methods for the manufacture of such a device.

TECHNICAL BACKGROUND

Arrays of high-efficiency and high-brightness LEDs are at the moment considered for illumination. To make this feasible, individual LEDs have to be assembled at a fine pitch on a sub-mount.

At the moment thin-film processing on silicon substrates is already used to fabricate these sub-mounts. The use of silicon is advantageous, as silicon processing is well known, readily available and it is possible to produce metal structures on silicon at a sufficiently small pitch for use as circuitry for driving the LEDs. At the same time, silicon has a reasonable thermal conductivity to transport heat away from the LED.

Presently, the circuitry is grown on a thin isolating gate oxide to minimize the thermal resistance between the LEDs and the silicon substrate, and the LEDs are connected to the circuitry on top of the same.

In multi-LED applications, with several LEDs located at a fine pitch on the substrate, it is further desired to avoid cross-talk between LEDs, that is that light, which is emitted from the sidewalls of the LEDs, couples into a neighboring LED (optionally of a different color) and is absorbed there.

One way of preventing cross-talk between LEDs is to locate the LEDs in recesses in the substrate so that the walls of the recesses prevent the cross-talk between LEDs. However, the process of arranging the circuit pattern in such recesses is not straight forward, and thus, it has been suggested to lithographically build walls around the individual LEDs to prevent cross talk.

Another problem in multi-LED applications is that LEDs, and especially high power LEDs, dissipate a lot of heat energy when emitting light. This heat dissipation presents limits on how long or with which power the LEDs can operate. Thus it is much desired to obtain a good heat transport away from the LED. Conventionally this is done by placing the silicon-based sub-mount on a heat sink, with the side of the sub-mount housing the LEDs facing away from the heat sink. However, it would be advantageous to reduce the thermal resistance between the heat sink and the LED, as this would reduce the limitations due to the heat dissipation.

An alternative way of preventing cross-talk is disclosed in JP 61061458 A, to OKI Electric Ind Co Ltd. In this publication, a pattern of LEDs of mesa structure is arranged on a substrate. A photosensitive resin is then spin-coated on the substrate, thus filling the areas between the LEDs with a material forming light shielding regions between the LEDs. The circuit pattern is then arranged on top of the structure.

This method does however not provide improved heat transport away from the LEDs.

Thus it still remains a need for a LED-based lighting device that is easily produced and provides improved heat transport away from the LEDs. Especially there is a need for such devices with a reduced cross-talk between neighboring LEDs.

SUMMARY OF THE INVENTION

One object of the present invention is to provide a light-emitting device that overcomes the above-mentioned drawbacks, as well as methods for the manufacture of such devices.

In a first aspect, the present invention thus provides a light-emitting device comprising a substrate, a circuitry, a heat sink and a light emitting diode (LED), being electrically connected to said circuitry, wherein the LED is in thermal contact with said heat sink through an opening in said substrate.

One advantage with a device according to the invention is, that since the LED and the heat sink is in thermal connection via an opening in the substrate, no substrate material is in the heat path. The materials in the heat path are preferably chosen to have a thermal conductivity higher than the thermal conductivity of the substrate material. The thermal conductivity of the connection may thus be higher than if the heat was to be transported through the substrate material. As used herein, the term "circuitry" refers to a pattern of passive electric conductors, i.e. the wiring to which electrical components, such as diodes, transistors, switches, etc, may be connected. Grounding connection between a component and a ground, which for example may be the heat sink, is also part of the circuitry.

As used herein, the term "heat sink" refers to a means for transporting heat away from a heat-dissipating component, such as a light emitting diode. The term is to be taken to include so called intermediate heat sinks that transports heat from the heat dissipating component to a second heat sink that may be common for several intermediate heat sinks.

As used herein, a "LED" refers to a single light emitting diode (LED) or a plurality of LEDs formed on one chip, so called "multifold chips". The term further relates to all types of LEDs, for example organic LEDs (OLEDs), polymeric LEDs (polyLEDs) and conventional inorganic LEDs, emitting light of any wavelength, from ultraviolet through visible to infrared light. The term LED is also taken to include laser diodes (LDs).

The terms "in thermal connection with" and "thermally connected to" refers to that the thermal conductivity between the two components, such as between a LED and a heat sink is high, preferably higher than the thermal conductivity of the substrate material. Two components may thus be thermally connected to each other even if they are separated by one or more additional components, as long as such additional components have a thermal conductivity higher than the conductivity of the substrate material.

Further, according to the present invention, the LED is preferably arranged in thermal connection with the heat sink, at least partly via the circuitry, through the opening in the substrate.

The LED is electrically connected to the circuitry, but it may be advantageous if the LED is also thermally connected to the circuitry while the circuitry is thermally connected to the heat sink, especially if the circuitry is formed of a material with high thermal conductivity. Thus, at least part of the heat dissipated by the LED is transported to the heat sink via the circuitry, through the opening in the substrate.

Preferably, also the LED is connected to said circuitry through said opening. Even though the circuitry may be mainly arranged on the side of the substrate which is opposite from the LED, a part of the circuitry is exposed in the opening, allowing the LED to be connected to the circuitry through the opening in the substrate.

More preferably, the circuitry is arranged on the heat sink, optionally at least partly separated by a dielectric layer, and the LED is arranged on the circuitry.

This allows for a high contact area between the heat sink and the circuitry and between the LED and the circuitry, allowing high thermal conductivity between the LED and the heat sink. Further it minimizes the distance between the LED and the heat sink, which also increases the thermal conductivity from the LED to the heat sink.

The LED may at least partly be located in the opening in the substrate. In this way direct contact between connection pads on the LED and the circuitry is allowed, and thus, a good thermal connection between the LED and the heat sink is possible to achieve.

Furthermore, cross talk between two neighboring LEDs, which is due to that the LED emits light in a direction parallel to the surface of the substrate, is reduced by arranging the LED in the opening, especially if the substrate is made of a non-translucent material or if the inner walls of the opening reflects or absorbs light. By arranging the LED in an opening in the substrate, it is not necessary to lithographically build walls around the LED to prevent cross talk between neighboring LEDs.

The circuitry may form protrusions in the opening in the substrate. Such protrusions facilitate the attachment of the LED to the circuitry and provide a well-defined spacing between the LED and the bottom of the opening, which creates a cavity between the LED and the bottom of the opening. Such a cavity may be filled with a thermally conductive under-fill material to further improve the heat transport from the LED to the heat sink.

In devices according to the present invention comprising two or more LEDs, each being in thermal connection with a heat sink, via the circuitry, through an opening in the substrate, the LEDs may be connected to the one common or two different heat sinks. It is however advantageous that the LEDs are connected to separate heat sinks in order to reduce the mechanical stress on the device.

In a second aspect, the present invention provides a method for the manufacture of a light-emitting device. The method comprises providing a substrate, a circuitry, a heat sink and a LED, arranging said circuitry on said substrate, obtaining an opening in said substrate, arranging said LED in electrical connection to said circuitry, and arranging said heat sink in thermal connection to said LED, whereby said thermal connection is effected through said opening.

Preferably, in the method according to the present invention, the electrical connection between the LED and the circuitry is effected through the opening in the substrate.

Thus, a light emitting device, in which the LED is thermally connected to the heat sink, at least partially via the circuitry, through the opening in the substrate is produced.

This method thus allows the manufacture of lighting devices according to the invention wherein there is no substrate material between the LED and the heat sink, which allows for a good heat transfer away from the LED.

The method may also comprise additional steps, such as the depositing of protective layers, such as electrically isolating layers between the circuitry and the substrate and/or heat sink and deposition of etch masks.

The manufacturing method also allows for easy manufacturing of additional openings or through substrate via holes through site-specific etching.

DETAILED DESCRIPTION OF PREFERRED EMBODIMENTS

The present invention will now be further described with reference to the drawings.

Figure 1:
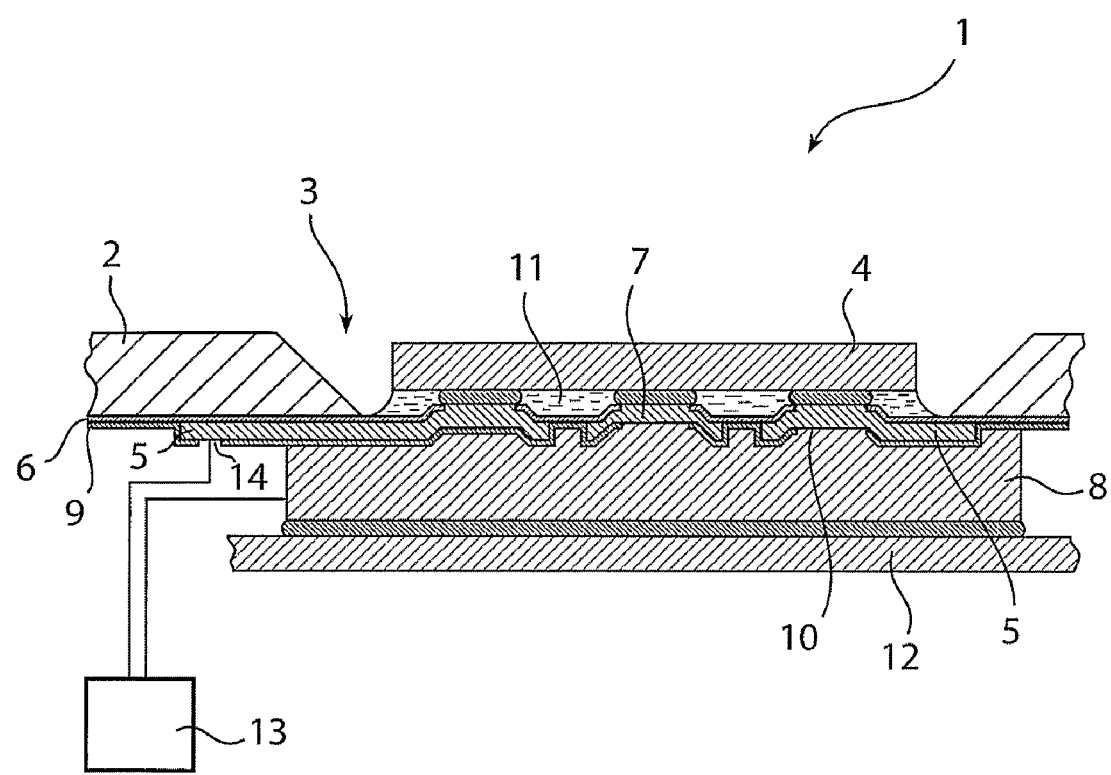
FIG. 1 illustrates a cross sectional view of a lighting device of the present invention.

One embodiment of the present invention, as illustrated in FIG. 1 shows a lighting device 1 according to the present invention comprising a substrate 2 provided with an opening 3 in which a LED 4 is arranged.

A circuitry 5 is arranged on the substrate 2, separated from the substrate by a layer of dielectric 6. However at certain parts of opening 3, no dielectric is arranged on the circuitry 5, so that the circuitry is accessible in the opening.

The LED 4 is electrically, and thermally, connected to the circuitry at the accessible parts of the circuitry 5 in the opening 3. The LED is also thermally, but not electrically, connected to a thermal bump 7.

An intermediate heat sink 8 is arranged on, and in thermal connection to, the circuitry 5 and the thermal bump 7, and is partly electrically isolated from the circuitry 5 by a thermally conducting dielectric layer 9. However, the heat sink 8 acts as ground connection for the circuitry and thus, in one location 10 of the circuitry the circuitry is in electrical contact with the intermediate heat sink 8.

The circuitry 5 and the thermal bump 7 forms protrusions in the bottom of the opening, which forms a cavity 11 between the LED 4 and the bottom of the opening. The cavity 11 is filled with a thermally conductive under-fill, which further improves the thermal connection between the LED 4 and the intermediate heat sink 8, and the intermediate heat sink 8 is soldered to a second heat sink 12.

The LED 4 is further connected, via the circuitry 5, to a LED driver unit 13, which controls the LED. The LED driver unit 13 is connected to the circuitry 5 at a location of the circuitry not being covered by the heat sink, via an opening 14 in the thermally conductive dielectric layer 9.

The substrate 1 may be any substrate known to those skilled in the art as suitable to use in a sub-mount for a light-emitting device. Preferably, the substrate material is such that it is fairly easy to produce recesses and openings in the substrate by etching. Suitable substrates typically include, but are not limited to, standard silicone substrates, diamond and aluminum nitride.

The area of the opening 3 is preferably big enough for the LED 4 to be fitted in the opening. Furthermore, the opening is also deep enough (i.e. the substrate is thick enough) so that the upper surface of the LED, when attached to the circuitry is essentially in level with or below the level of the upper surface of the substrate. Many LEDs suitably used in lighting devices of the present invention may emit light also in directions more or less parallel to the surface of the substrate. In certain applications, for example when utilizing several lighting devices of the present invention located beside each other, it may thus be advantageous that light emitted from one LED is prevented from being coupled into a neighboring LED and absorbed therein. Thus, in such cases it is advantageous that at least those parts of the LED that are capable of emitting light in a direction parallel to the surface of the substrate are located inside said opening so that light emitted in an essentially parallel direction is either absorbed or reflected by the walls of the opening. Preferably, the area of the opening is wider at the upper surface of the opening than at the bottom of the opening, thus forming inner walls of the opening, which are capable of reflecting light out from the opening.

In other embodiment of the present invention, the LED may be positioned on the surface of the substrate, either on top of the opening in the substrate or besides the opening, with electrical connectors reaching into the opening for connection to the circuitry, where the connectors transferring heat from the LED to the heat sink, via the circuitry.

LEDs suitable for use in the present invention may be LEDs emitting light of any color, including laser diodes. LEDs which have all their contacts on one side are however preferred, as this facilitates the connection to the circuitry.

The circuitry preferably comprises a patterned layer of a conducting metal, for example copper, aluminum, silver, gold, and other suitable conducting metals, as well as other non-metal or metal comprising conducting materials, suitable for use as a circuitry for a light emitting devices, such as AlSi. Preferably the thermal conductivity of the circuitry is higher than the thermal conductivity for the substrate.

The circuitry is preferably electrically isolated from the substrate, for example by a layer of dielectric material, preferably having a high thermal conductivity, arranged between the circuitry and the substrate.

Non-limiting examples of such dielectric materials include for example AlN, diamond, $Si_3N_4$ and SiC.

The circuitry shown in FIG. 1 is partly electrically isolated from the heat sink by a thermally conductive dielectric material. However, in some embodiments of the present invention, it preferred that the circuitry is totally isolated from the heat sink. Suitable dielectric materials for isolating the circuitry from the heat sink include, but are not limited to diamond, SiC and AlN.

The circuitry advantageously comprises at least one part, which is exposed to the surroundings on the backside of the device (i.e. the heat sink side). Such an exposed part may be used as a connection between the circuitry and LED driver unit, which will be used to control the function of LEDs electrically connected to the circuitry.

The use of a thermal bump, separate from the circuitry, is optional, but may be used to further improve the thermal contact between the LED and the heat sink. The thermal bump is preferably made of electrically conducting or non-conducting material with high thermal conductivity, at least higher than the thermal conductivity of the substrate. Suitable materials for the thermal bump are for example, but are not limited to, the materials suitable for use in the circuitry.

The intermediate heat sink is preferably made of a material of high thermal conductivity, such as, but not limited to metals, for example copper, silver, gold, wolfram and other metallic or non-metallic materials with high thermal conductivity. Such materials are known to those skilled in the art.

In other preferred embodiments of the present invention, several lighting devices according to the present invention are arranged to an array of lighting devices. In such arrays, several LEDs may be arranged on one and the same substrate, but in separate openings, or may be arranged on separate substrates. Several devices may be thermally connected to one common intermediate heat sink or separate intermediate heat sinks. It is however preferred that each LED is thermally connected to a separate intermediate heat sink, as this reduces the mechanical strains on the device that appear for example due to thermal expansion of the heat sink. In those cases it may however be preferred to arrange all such heat sinks on a common second heat sink, to improve the mechanical support and the heat sinking properties for the devices.

Materials suitable for the second heat sink is materials with high thermal conductivity and include, but are not limited to, a CuW-alloy, a Copper/molybdenum alloy, metal matrix composites such as silicon-carbide-particle-reinforced aluminum (Al/SiC), carbon/carbon composites and ceramic matrix composites, such as diamond-particle-reinforced silicon carbide.

The cavity between the LED and the bottom of the opening is preferably filled with a thermally conductive material to improve the thermal connection between the LED and the heat sink. Suitable such materials include, but are not limited to epoxies filled with thermally conductive ceramic particles.

Preferably, the circuitry may be connected to a LED driver unit that controls the function of the LED(s) connected to the circuitry. Suitable such LED driver units are known to those skilled in the art.

It is to be understood that a device according to the present invention also relates to a device comprising a plurality of LEDs each arranged described above in separate openings on one single substrate, while sharing an at least partly common circuitry.

A device according to the present invention may also comprise "through substrate via holes", i.e. open holes through the substrate. The device may be covered by a light collimator arranged above a LED or an array of LEDs to spread the light emitted from the LED(s) in a desired way, and the void between such a collimator and the LED(s) may be filled with a silicone paste. A through substrate via hole may be used to fill such a void with the silicone paste.

EXAMPLE

An example of a method for manufacturing a light-emitting device shown in FIG. 1 is now described, and is outlined in FIG. 2.

(i) Fabrication of Circuitry

The method starts with the fabrication of the circuitry and thermal bumps, which in this embodiment will form protrusions in the opening.

A silicon substrate with a thickness of approximately 625 μm is provided. On the side, which is to become the circuitry side, of the silicon substrate, a hard etch mask (0.5 μm $SiO_2$) was grown and patterned, leaving openings in the mask, which openings defined the location for the protrusions, followed by KOH etching to a depth of 5-20 μm in the openings, and the $SiO_2$ was stripped off the substrate.

Next, a dielectric material, $Si_3N_4$, was deposited and patterned on the circuitry side substrate to provide an electrical isolation between the substrate and the circuitry, leaving openings in the dielectric material at the positions for the protrusions.

The circuitry was applied on the substrate by depositing and patterning a thick (1-5 μm) aluminum layer, and on the circuitry, a thin (~100 nm) dielectric with a high thermal conductivity (AlN) was sputtered to isolate the circuitry from the environment, especially from the heat sink.

Figure 2A:
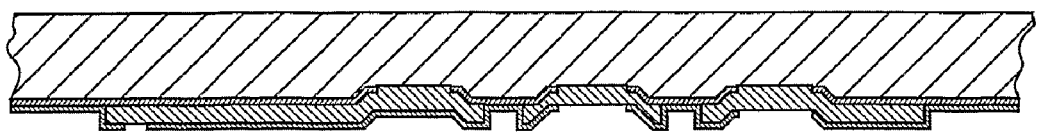
FIG. 2, a-d, outlines the steps of a method for the manufacture of the lighting device in FIG. 1.

The thermal bump is not electrically connected to the LED, and thus this AlN-layer could be removed from the thermal bump by etching (70° C. KOH etch) to provide a direct thermal and electrical connection to the heat sink. Moreover, as the heat sink acts as an electrical ground for the LED, the AlN-material could also be removed from the part of the circuitry that would act as the grounding connection to the heat sink. Furthermore, at one area of the circuitry, which will not be covered by the heat sink, the AlN-material is removed to provide an area of the circuitry, which is to be exposed to the surroundings of the heat sink side of the device. (FIG. 2a).

(ii) Defining the Opening

Then, the substrate was thinned down, from the LED side of the substrate, to approximately the thickness of the LED (~200 um) by grinding and wet damage etching. A hard-etch mask (Cr/Cu) was deposited on the LED side of the substrate and was patterned to define the area for the opening.

(iii) Plating the Intermediate Heat Sink

Figure 2B:
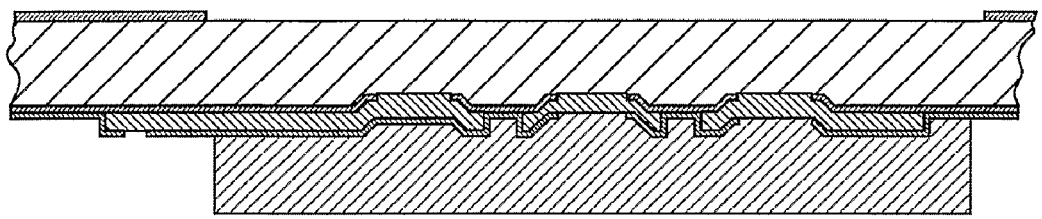

To deposit the intermediate heat sink, a plating base (Cr/Cu) was sputtered on the circuitry side of the substrate, and a thick (20-100 µm) resist was patterned on the plating base to define the location for the intermediate heat sink. The intermediate heat sink (copper, ~50 µm) was then plated on the plating base at the defined location (FIG. 2b).

(iv) Etching the Opening

After removing the resist, an opening, the area of which was defined by the previously deposited hard etch mask, was etched from the LED side of the substrate down to the circuitry and/or the dielectric $Si_3N_4$ material on which the circuitry was deposited. During this step, the circuitry side of the substrate was protected from the etching by the plating base and the heat sink.

Figure 2C:
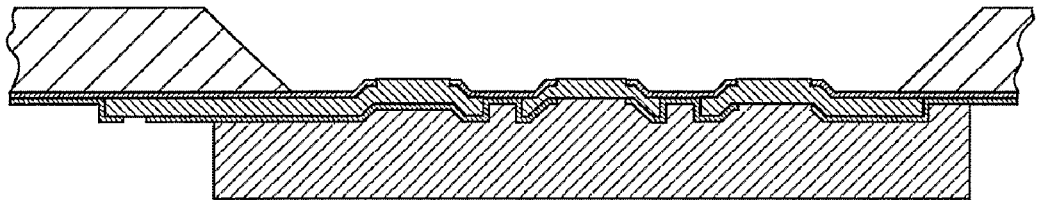

After this, the plating base was removed by wet etching, which also removed the hard etch mask from the LED side of the substrate (FIG. 2c).

(v) Attaching the LED

The parts of the circuitry now exposed in the opening and forming protrusions in the opening were provided with a solder wetting layer, Ni/Au, by electro-less growth. During this step a Ni/Au layer also become deposited on the copper intermediate heat sink on the circuitry side of the substrate, which will prevent it from corroding.

Figure 2D:
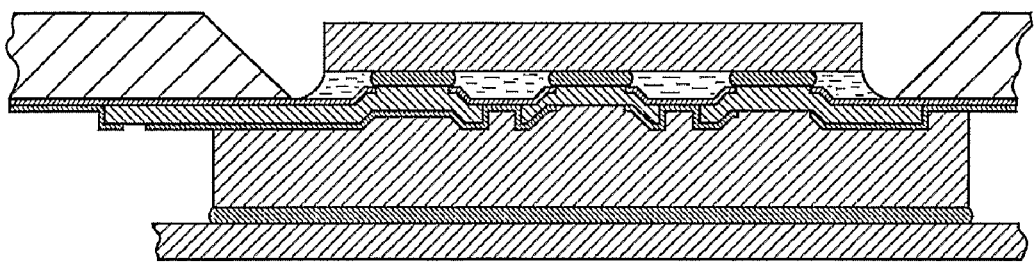

Finally the LED may be soldered to the circuitry and underfilled, and the device is soldered to a CuW heat sink (FIG. 2d).

It is to be understood that even if this description relates to arranging one single LED in thermal contact to a heat sink through an opening in the substrate to form a lighting device according to the present invention, it also relates to a method for parallel arranging several LEDs in thermal contact with heat sinks through several openings in one substrate.

The proposed method also provides a method for the manufacture of via holes through the substrate.

The manufacturing of through substrate via holes may for example by performed as follows:

Before plating the intermediate heat sink, the $SiO_2$ layer, on which the circuitry is deposited, and the thermally conductive dielectric material, which isolates the circuitry from the intermediate heat sink, is removed from a small area, to expose the substrate material. When the intermediate heat sink is plated, also a ring of that material is plated around the thus exposed area. During the step of etching the opening in the LED side of the substrate, the exposed area will thus not be protected, and consequently, a through substrate via hole will be obtained at the desired location.

The invention claimed is:

1. A light-emitting device comprising:
   a substrate defining an opening therethrough, the substrate having a first side and an opposing second side;
   a circuitry attached to the first side of the substrate;
   a heat sink attached to the circuitry; and
   a LED electrically connected to the circuitry from a second side of the substrate through the opening wherein the LED has a thermally-conductive connection to the heat sink at least partially via the circuitry, such that the thermally-conductive connection via the circuitry is at least partly disposed in the opening.

2. A light-emitting device according to claim 1, wherein the LED is electrically connected to the circuitry through the opening.

3. A light-emitting device according to claim 2, wherein the circuitry forms protrusions in the opening.

4. A light-emitting device according to claim 1, wherein the LED is at least partly disposed in the opening.

5. A light-emitting device according to claim 1, comprising a first LED having a thermally-conductive connection to a first heat sink through a first opening in the substrate and at least partially via the circuitry, and a second LED having a thermally-conductive connection to a second heat sink through a second opening in the substrate and at least partially via the circuitry.

6. A light-emitting device according to claim 1, wherein the LED is fully disposed in the opening.

7. A method for the manufacture of a light emitting device, comprising:
   attaching a circuitry to a first side of a substrate;
   creating an opening in the substrate;
   attaching a heat sink to the circuitry;
   electrically connecting a LED to the circuitry from a second side of the substrate through the opening; and
   creating a thermally-conductive connection between the LED and the heat sink at least partially via the circuitry, such that the thermally-conductive connection via the circuitry is at least partly disposed in the opening.

8. A method according to claim 7, wherein the LED is electrically connected to said circuitry through the opening.

9. A method according to claim 7, wherein the opening is created by etching.

10. A method according to claim 7, wherein the LED is fully disposed in the opening.

* * * * *